(12) United States Patent
Byagowi (10) Patent No.: US 11,581,972 B1
(45) Date of Patent: Feb. 14, 2023

(54) REPORTING CLOCK VALUE OF NETWORK INTERFACE CONTROLLER FOR TIMING ERROR ANALYSIS

(71) Applicant: Meta Platforms, Inc., Menlo Park, CA (US)

(72) Inventor: Ahmad Byagowi, Milpitas, CA (US)

(73) Assignee: Meta Platforms, Inc., Menlo Park, CA (US)

( * ) Notice: Subject to any disclaimer, the term of this patent is extended or adjusted under 35 U.S.C. 154(b) by 357 days.

(21) Appl. No.: 16/880,890

(22) Filed: May 21, 2020

(51) Int. Cl.
*H04J 3/06* (2006.01)
*H03K 5/156* (2006.01)
*H03K 5/135* (2006.01)
*G04R 20/02* (2013.01)

(52) U.S. Cl.
CPC ............ *H04J 3/0652* (2013.01); *G04R 20/02* (2013.01); *H03K 5/135* (2013.01); *H03K 5/156* (2013.01)

(58) Field of Classification Search
CPC ....... H04J 3/0652; G04R 20/02; H03K 5/135; H03K 5/156
See application file for complete search history.

(56) References Cited

U.S. PATENT DOCUMENTS

| | | | | |
|---|---|---|---|---|
| 3,624,643 A * | 11/1971 | Richman | ................ | G06G 7/18 708/805 |
| 5,740,083 A * | 4/1998 | Anderson | ............... | G01P 3/489 702/148 |
| 7,215,785 B1 * | 5/2007 | Ju | ......................... | A63H 30/04 367/125 |
| 9,197,414 B1 * | 11/2015 | Martin | ...................... | H04L 9/12 |
| 11,070,304 B1 * | 7/2021 | Levi | ..................... | H04J 3/0673 |
| 2003/0058160 A1 * | 3/2003 | Kitabatake | ............. | G01S 7/282 342/204 |
| 2003/0232620 A1 * | 12/2003 | Runkle | ................. | G01S 13/765 455/423 |
| 2004/0189368 A1 * | 9/2004 | Mehalel | ................. | H03K 5/135 327/277 |
| 2013/0148639 A1 * | 6/2013 | Gao | ....................... | H04W 16/14 370/336 |
| 2016/0309434 A1 * | 10/2016 | Regev | .................... | H04L 43/106 |
| 2020/0029350 A1 * | 1/2020 | Asterjadhi | ........ | H04W 28/0268 |
| 2021/0203428 A1 * | 7/2021 | Bordogna | ............. | H04J 3/0697 |
| 2021/0320736 A1 * | 10/2021 | Li | ......................... | H04J 3/0641 |

* cited by examiner

*Primary Examiner* — Christine Ng
(74) *Attorney, Agent, or Firm* — Van Pelt, Yi & James LLP (57) ABSTRACT

A trigger signal provided via a pulse-per-second input port of a network interface controller is detected. In response to the trigger signal, an internal hardware clock value of the network interface controller is recorded. The recorded internal hardware clock value is reported, wherein the reported internal hardware clock value is reported for use in determining a timing error of the network interface controller based at least in part on a comparison with a time value of another device that also received the trigger signal.

20 Claims, 8 Drawing Sheets

REPORTING CLOCK VALUE OF NETWORK INTERFACE CONTROLLER FOR TIMING ERROR ANALYSIS

BACKGROUND OF THE INVENTION

A network interface controller (NIC) is a computer hardware component that connects a computer to a computer network. NICs may also be referred to as network interface cards, network adapters, local area network (LAN) adapters, physical network interfaces, or other similar terms. NICs implement the electronic circuitry needed to communicate among computers in a network (e.g., a LAN). Computers in a network can be synchronized by synchronizing the NICs of the computers. Synchronization may be required to synchronize financial transactions, mobile phone tower transmissions, and other operations in networks that require precise timing. Various synchronization protocols can be used. To better evaluate the performance of these protocols and to better understand computer network synchronization, it would be beneficial to develop techniques directed toward improving measurement and analysis of computer network synchronization and associated timing parameters.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Network interface controller timing evaluation is disclosed. A trigger signal provided via a pulse-per-second input port of a network interface controller is detected. In response to the trigger signal, an internal hardware clock value of the network interface controller is recorded. The recorded internal hardware clock value is reported, wherein the reported internal hardware clock value is reported for use in determining a timing error of the network interface controller based at least in part on a comparison with a time value of another device that also received the trigger signal.

A practical and technological benefit of the techniques disclosed herein is improved ability to evaluate and analyze performance of computer network synchronization protocols. For example, network time protocol (NTP) and precision time protocol (PTP) are commonly used protocols to synchronize clocks throughout a computer network. PTP, due to its higher accuracy, is more suitable for applications that require high precision. NTP, though, is typically easier to implement and may be more appropriate for applications that do not require the precision of PTP. PTP has been published as the IEEE-1588 standard. In various scenarios, PTP is implemented as a packet-based synchronization protocol using Ethernet connections. The performance of NTP and PTP can be better evaluated and understood by utilizing the techniques disclosed herein. PTP typically performs synchronization across various levels in a hierarchy of computers in a network. Timing errors in the various stages of the hierarchy, with or without utilization of synchronization protocols, can be evaluated using the techniques disclosed herein. Existing direct measurement techniques to examine timing errors, such as using oscilloscopes or other probes, are cumbersome and not easily scalable. Indirect measurement techniques are oftentimes not as accurate. An advantage of the techniques disclosed herein is that they are accurate and scalable.

Figure 1:
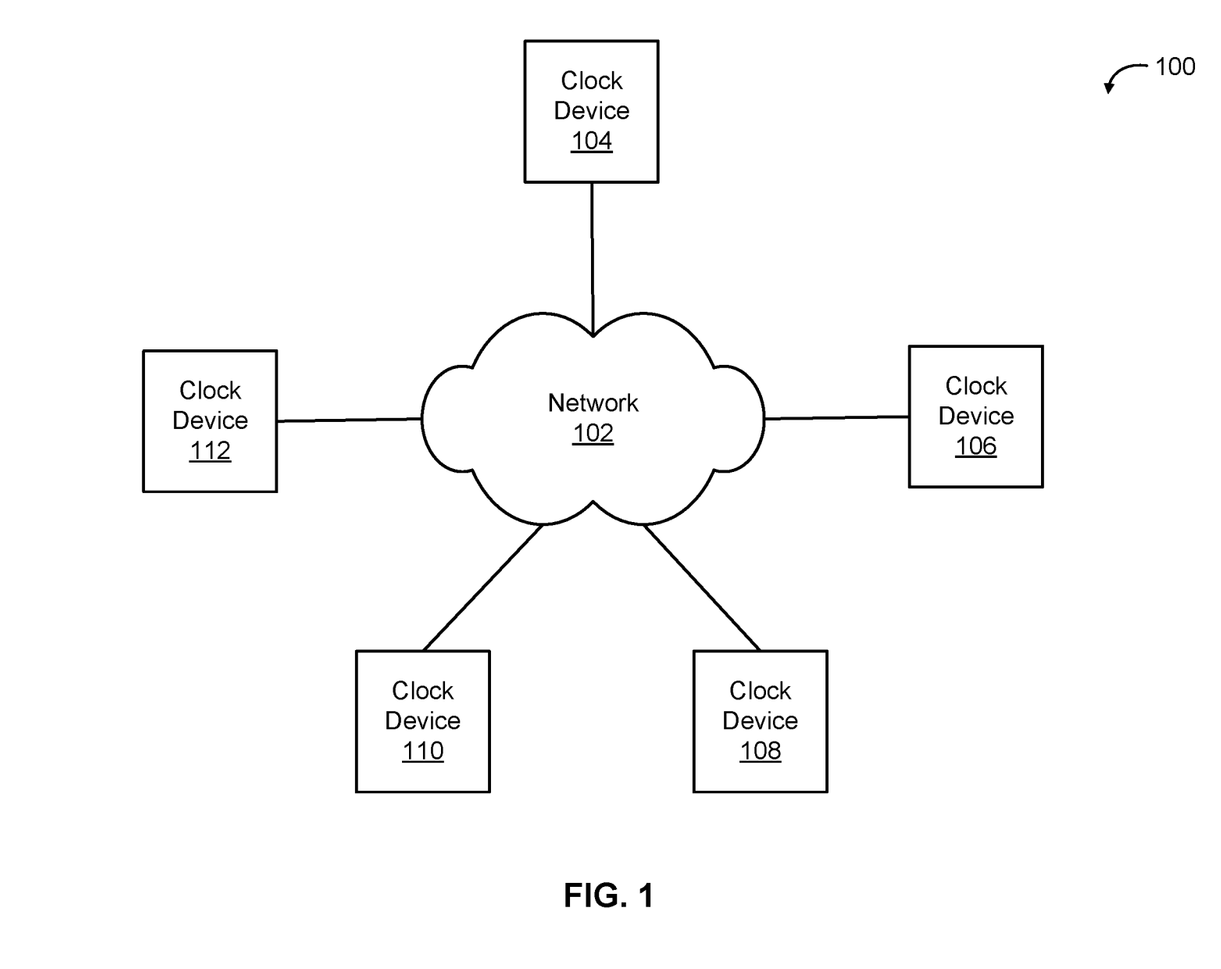
FIG. 1 is a diagram illustrating an embodiment of a network of clock devices.

FIG. 1 is a diagram illustrating an embodiment of a network of clock devices. In system 100, clock devices 104, 106, 108, 110, and 112 are communicatively connected to one another through network 102. The number of clock devices shown is merely illustrative. It is possible for there to be fewer or more clock devices in system 100. In some embodiments, network 102 is a LAN. Other examples of network 102 include one or more of the following: a direct or indirect physical communication connection, mobile communication network, Internet, intranet, Wide Area Network, Storage Area Network, and any other form of connecting two or more systems, components, or storage devices together. In some embodiments, the clock devices are NICs. For example, physical hardware clocks (PHCs) located on NICs may be utilized to keep time. In various embodiments, a PHC generates internal hardware clock values corresponding to the time kept by the PHC. In some embodiments, internal hardware clocks utilize 80-bit counters (80 binary digits), of which 48 bits measure sub-second time. In various embodiments, the NICs are parts of computers connected to network 102. In some embodiments, one of the clock devices is a NIC that incorporates or is communicatively connected to an atomic clock.

In various embodiments, the clocks in system 100 exhibit timing errors that are remedied with a network synchronization protocol such as NTP, PTP, or another protocol. In some embodiments, one of the clocks serves as a master clock against which other clocks are synchronized. This master clock may be referred to as a grandmaster, time provider, or another similar term. The grandmaster may be a clock that is of higher quality and more accurate than the other clocks, such as an atomic clock. The grandmaster may be selected based on a master clock selection algorithm (e.g., best master clock algorithm). Clocks other than the grandmaster can be ordinary clocks (non-grandmaster clocks with a single network connection, also referred to as slaves), boundary clocks (clocks with multiple network connections that can synchronize one network segment to another), or transparent clocks (clocks that modify messages passing through and can measure and adjust for network delays).

In various embodiments, each clock device (e.g., a NIC) includes a pulse-per-second (PPS) output port. In various embodiments, the PPS output port provides synchronization signals. In various embodiments, each clock device (e.g., a MC) also includes a PPS input port. As described in further detail below, in the techniques disclosed herein, the PPS input port can be utilized to receive a trigger signal in response to which an internal hardware clock value is recorded. In some embodiments, the PPS input port is a configurable PPS port (that can be configured as either an input port or an output port) that is configured to be an input port. In some embodiments, PPS ports are configured to physically couple to cables, such as using SubMiniature version A (SMA) connectors. PPS signals refer to signals that have a width of less than one second and a sharply rising and/or falling edge that accurately repeats once per second. As used herein, a PPS signal can also have a repeat period other than one second. PPS signals may be generated by precision oscillators. Atomic clocks typically have a PPS output. PPS signals can be distributed to the clock devices in system 100 and utilized to synchronize clocks in the system.

Figure 2:
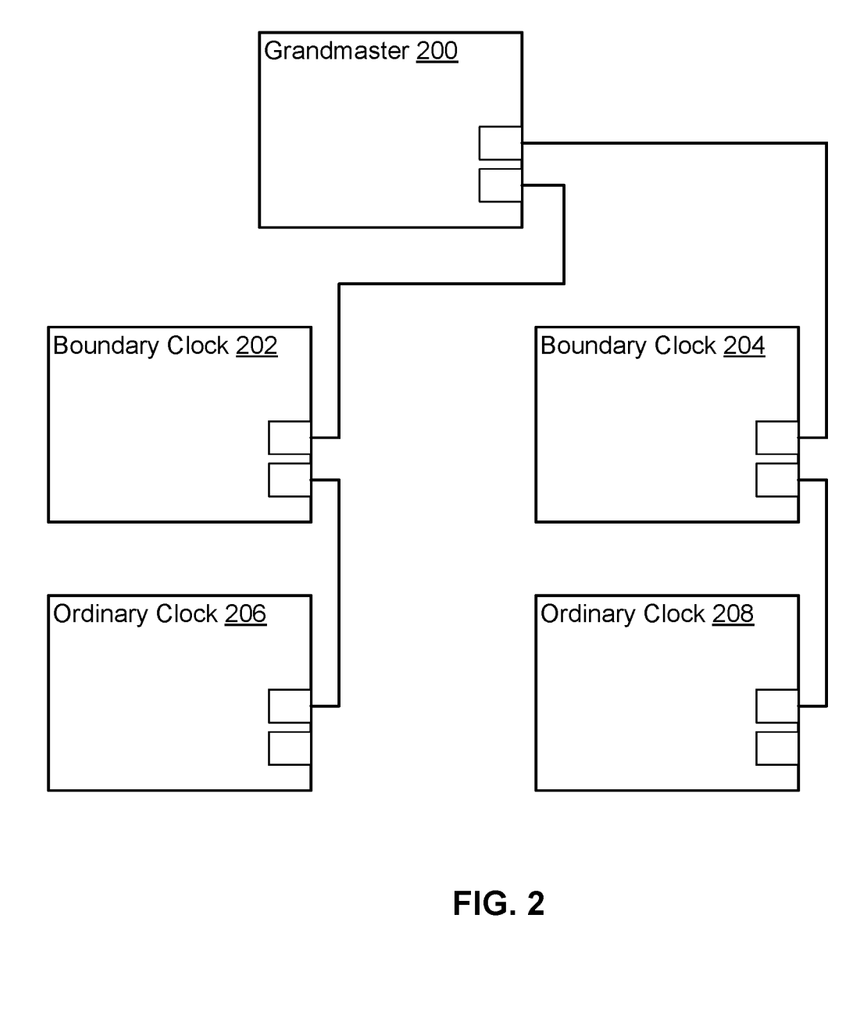
FIG. 2 is a diagram illustrating a first example topology for a network of clock devices.
Figure 3:
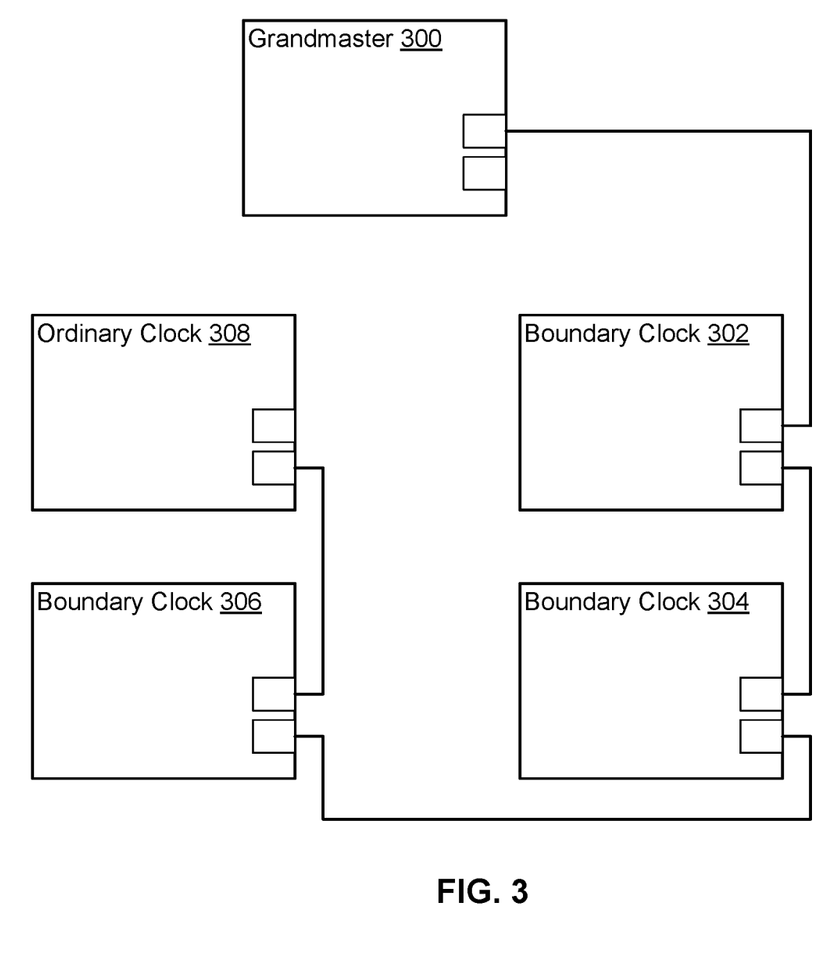
FIG. 3 is a diagram illustrating a second example topology for a network of clock devices.

The clock devices in system 100 may be communicatively connected in a variety of different topologies. The types of clock devices in system 100 may also vary. Timing errors can vary depending on the specific topology and types of devices. The performance of a network synchronization protocol (e.g., how long synchronization takes to complete) can also vary depending on the specific topology and types of devices. FIGS. 2 and 3 illustrate example topologies for a network with one grandmaster and four other clock devices.

FIG. 2 is a diagram illustrating a first example topology for a network of clock devices. In the example shown, grandmaster 200 is communicatively connected to boundary clock 202 and boundary clock 204. In the example shown, boundary clocks 202 and 204 comprise a boundary stage that has connections to both a grandmaster stage and an ordinary clock stage. Boundary clocks 202 and 204 synchronize from one network segment (grandmaster stage) to another (ordinary clock stage). In the example shown, ordinary clock 206 and ordinary clock 208 comprise a last stage of a hierarchy.

FIG. 3 is a diagram illustrating a second example topology for a network of clock devices. As with the topology shown in FIG. 2, there is on grandmaster (grandmaster 300 in this example). In contrast to the topology shown in FIG. 2, there are multiple boundary stages (boundary clocks 302, 304, and 306 connected serially) connecting a grandmaster stage (grandmaster 300) to an ordinary clock stage (ordinary clock 308). Synchronizing through various stages in a hierarchy of clocks using a protocol such as PTP results in timing error variances across the various stages. In many scenarios, timing errors increase in stages further from the grandmaster stage. Timing error variance based on hierarchy can be evaluated using the techniques disclosed herein (e.g., see FIG. 4).

Figure 4:
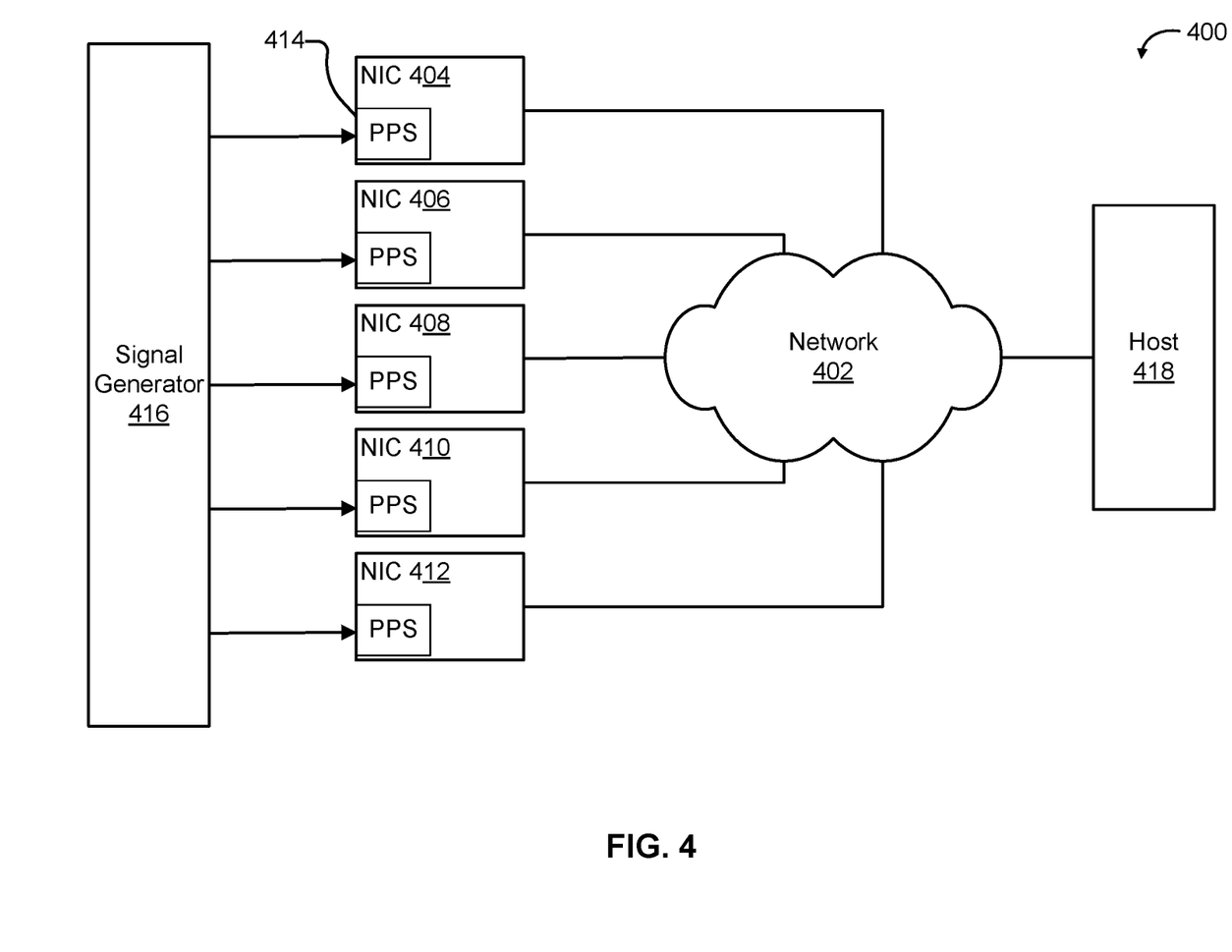
FIG. 4 is a block diagram illustrating an embodiment of a system for evaluating timing errors in a network of clock devices.

FIG. 4 is a block diagram illustrating an embodiment of a system for evaluating timing errors in a network of clock devices. In system 400, NICs 404, 406, 408, 410, and 412 are connected to one another via network 402. In some embodiments, the NICs are physically connected to one another with cables (e.g., Ethernet cables). In some embodiments, NICs 404, 406, 408, 410, and 412 are clock devices 104, 106, 108, 110, and 112 of FIG. 1 and network 402 is network 102 of FIG. 1. In various embodiments, the NICs in system 400 include clocks that have timing errors with respect to one another and can be synchronized using a network synchronization protocol such as PTP. In various embodiments, the NICs are part of computers connected to network 402. The NICs (and thus the clocks of the NICs and the computers housing the NICs) may be connected according to various topologies (e.g., the topology shown in FIG. 2, the topology shown in FIG. 3, or any other topology).

In the example shown, each NIC includes a PPS port (e.g., PPS port 414 of NIC 404) that is communicatively connected to signal generator 416. In some embodiments, the PPS ports (e.g., PPS port 414) are NIC PPS input ports. It is also possible for the PPS ports to be any other ports that are able to receive signals from signal generator 416. Signal generator 116 is an electronic device that generates electronic signals with set properties of amplitude, frequency, and wave shape. Various types of signal generators may be used. Examples of signal generators include function generators, arbitrary waveform generators, digital pattern generators, etc. Signal generator 416 may include microprocessor control and permit control from a personal computer. Signal generator 416 may be free-standing and self-contained or may be incorporated into a more complex system.

Figure 5:
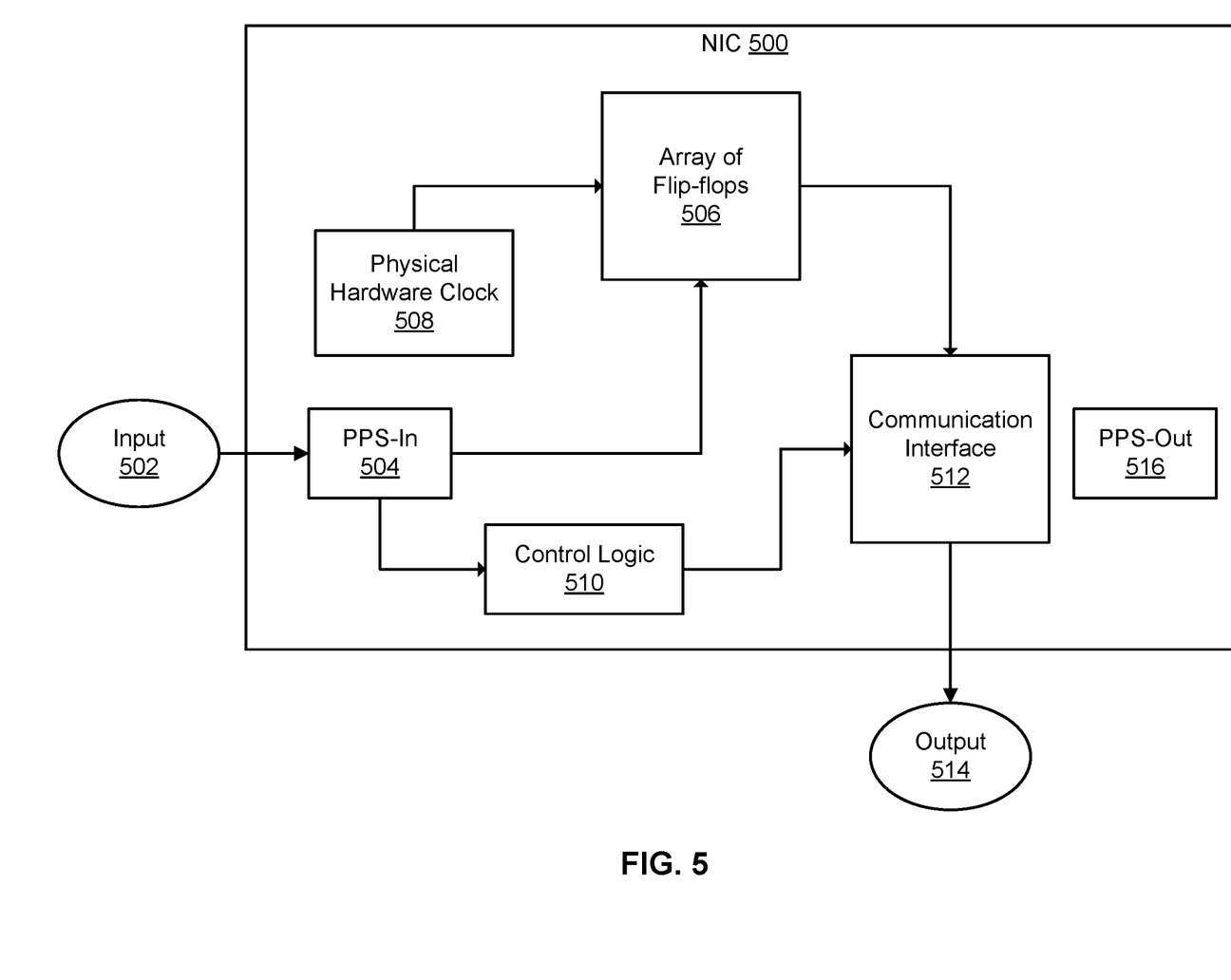
FIG. 5 is a diagram illustrating an example network interface controller for capturing an internal hardware clock value.

In various embodiments, signal generator 416 generates an electronic signal with a sharp rising edge that functions as a trigger signal to indicate to each NIC to perform a specified action. In some embodiments, signal generator 416 sends the trigger signal periodically, e.g., every second, every half second, or with some other specified periodicity. Each NIC receives the same trigger signal from signal generator 416 so that the NICs can perform the specified action at the same time upon detection of the trigger signal. In various embodiments, the trigger signal is transmitted from signal generator 416 to the NICs via data cables connecting signal generator 416 to the NICs. In various embodiments, the data cables are of equal or substantially similar lengths. This mitigates variance in the time it takes for the trigger signal to reach the various NICs due to differences in transit time of the trigger signal. Transit time can be computed as data cable length divided by the speed of light. Stated alternatively, in various embodiments, system 400 is configured to deliver the trigger signal to the PPS input ports of the NICs at the same time. The NICs can then be utilized as a set of measuring tools in which each NIC synchronously measures an internal hardware clock value. In various embodiments, the internal hardware clock value is a current PHC value. The internal hardware clock value can be recorded by the NIC (e.g., in an array of flip-flops or in a hardware register) and then reported out. FIG. 5 provides further details regarding measurement and reporting of the internal hardware clock value.

Figure 7:
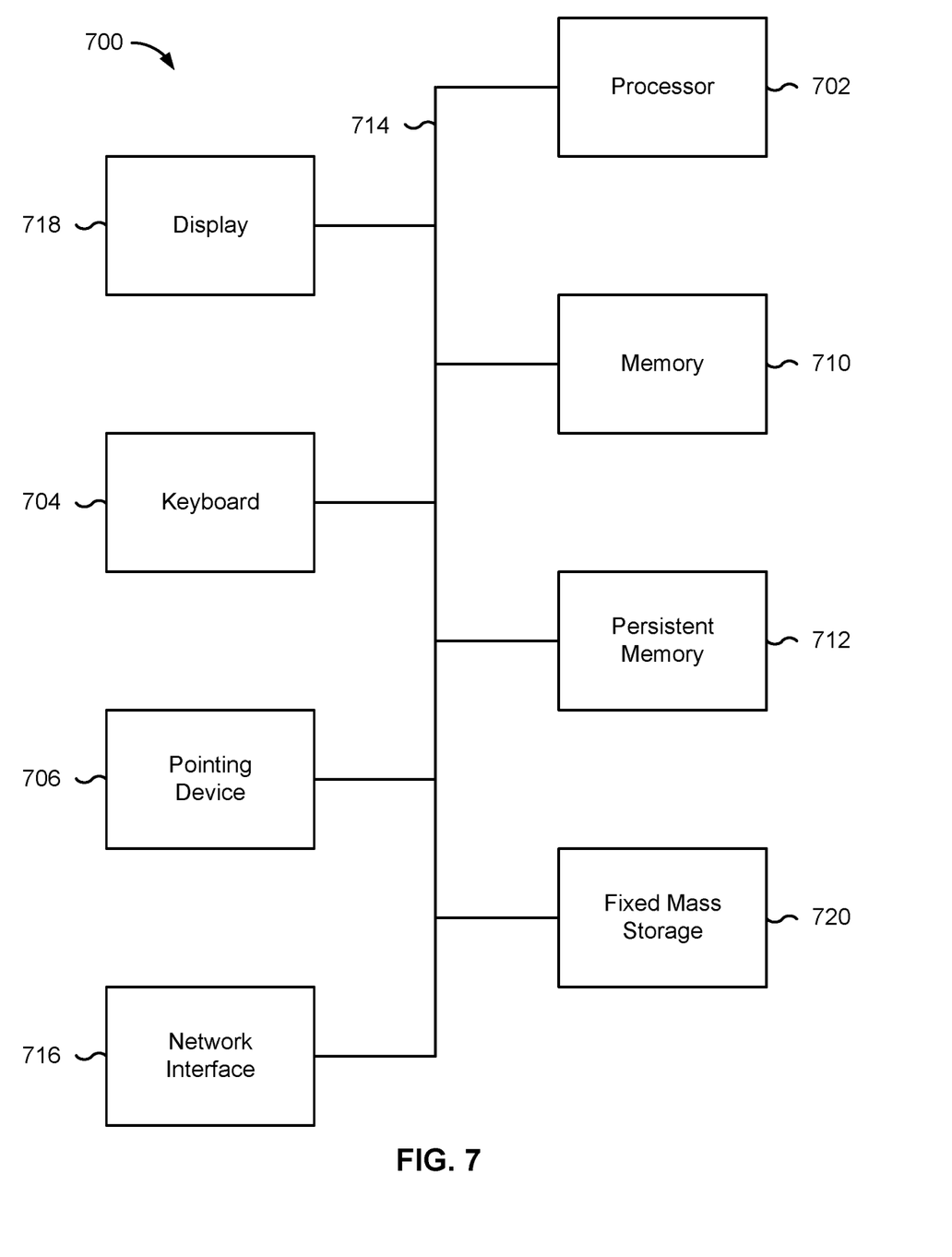
FIG. 7 is a functional diagram illustrating a programmed computer system.
Figure 8:
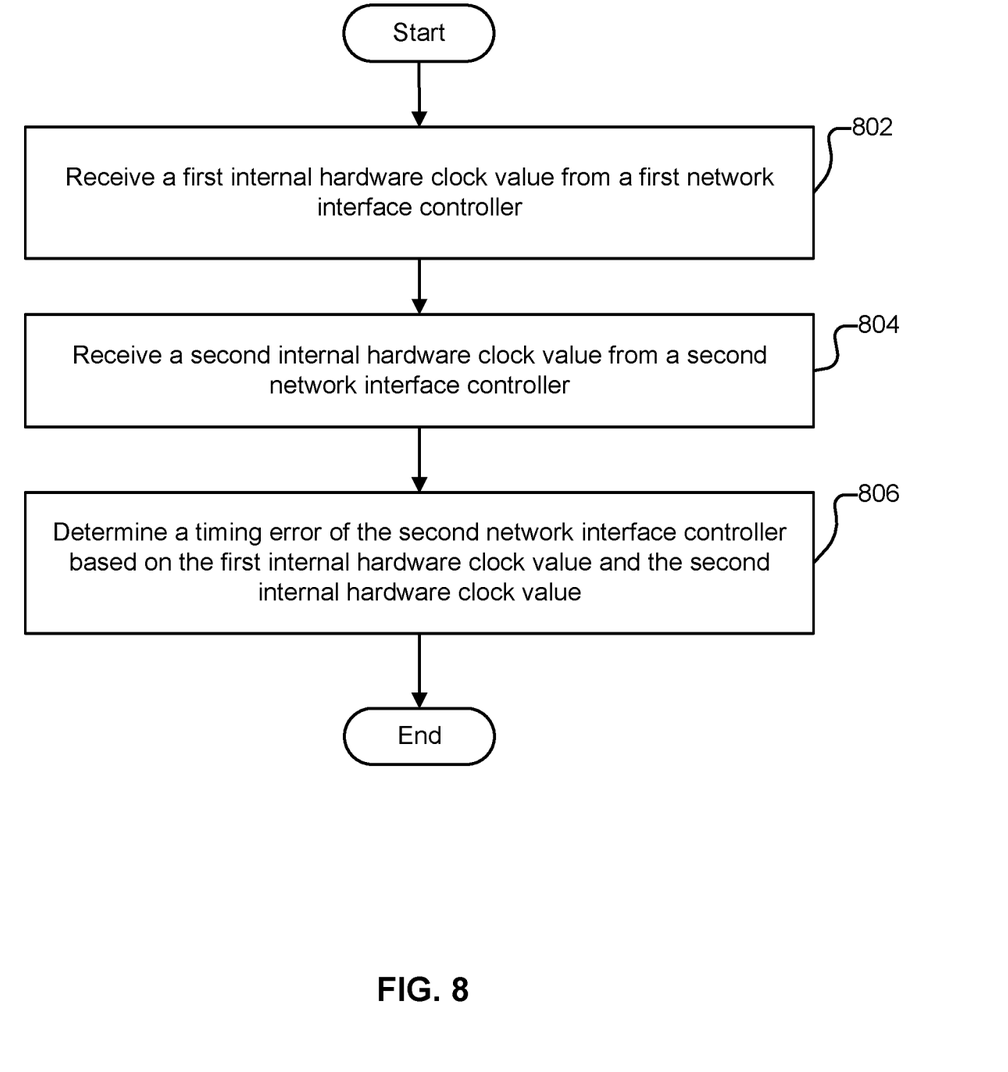
FIG. 8 is a flow chart illustrating an embodiment of a process for determining a timing error based on collected data.

In various embodiments, each NIC reports its synchronously measured internal hardware clock value to host 418 for analysis (see FIG. 8 for an example of analysis performed by host 418). In various embodiments, host 418 includes a processor and memory. In some embodiments, host 418 is a programmed computer system (e.g., programmed computer system 700 of FIG. 7). It is also possible for host 418 to be a computer system without all of the components of computer system 700 of FIG. 7 (e.g., no display, keyboard, pointing device, and/or other components). In various embodiments, host 418 stores and analyzes the internal hardware clock values that it receives to determine timing errors among the NICs. For example, host 418 can determine the offsets of the internal hardware clock values with respect to one another, which can be utilized to synchronize the NICs. In the example shown, host 418 is connected to the NICs via the same network (network 402) that connects the NICs. In some embodiments, the NICs and host 418 are connected via a switch of network 402 (not shown in FIG. 4) (e.g., an Ethernet switch).

In the example shown, portions of the communication path between the components are shown. Other communication paths may exist, and the example of FIG. 4 has been simplified to illustrate the example clearly. Although single instances of components have been shown to simplify the diagram, additional instances of any of the components shown in FIG. 4 may exist. For example, more NICs may exist. The number of components and the connections shown in FIG. 4 are merely illustrative. Components not shown in FIG. 4 may also exist.

FIG. 5 is a diagram illustrating an example network interface controller for capturing an internal hardware clock value. In the example shown, NIC 500 receives input 502 and generates output 514. In some embodiments, NIC 500 is one of the NICs in system 400 of FIG. 4. In some embodiments, input 502 is a trigger signal generated by signal generator 416 of FIG. 4. For example, input 502 may be an electronic signal with a sharp rising edge, wherein detecting the sharp rising edge triggers capturing an internal hardware clock value by NIC 500. In some embodiments, output 514 is a current (e.g., at the time the sharp rising edge is detected) internal hardware clock value (e.g., PHC value) of NIC 500.

In the example shown, PPS-In 504 receives input 502. In some embodiments, PPS-In 504 is a dedicated physical port of NIC 500. In the example shown, NIC 500 includes two PPS ports, PPS-In 504 (a PPS input port) and PPS-Out 516 (a PPS output port). In some embodiments, PPS-Out 516 is a dedicated physical port of NIC 500. In some embodiments, SMA connectors are used to physically connect data cables to the PPS ports. In various scenarios, PPS-Out 516 is utilized for network synchronization purposes. PPS-Out 516 port can be used to send and receive synchronization messages of a network synchronization protocol. In many scenarios, NICs with multiple PPS ports (e.g., NICs with a PPS input port as well as a PPS output port), utilize the PPS output port to send/receive synchronization protocol messages and the PPS input port to receive an external synchronization signal to use for synchronization in applications (e.g., banking) for which additional synchronization functionality is needed.

In the example shown, PPS-In 504 is connected to array of flip-flops 506. In some embodiments, array of flip-flops 506 is an array of D-type flip-flops. The flip-flops are connected to physical hardware clock 508. In various embodiments, physical hardware clock 508 is an integrated circuit clock (e.g., silicon-based, quartz crystal-based, etc.). In some embodiments, physical hardware clock 508 is a clock that is able to keep time more precisely than typical clocks (e.g., an atomic clock). It is also possible to receive high precision time from a Global Positioning System (GPS) source. A highly accurate clock may be utilized if NIC 500 functions as a grandmaster. It is also possible for an accurate clock (e.g., an atomic clock) external to NIC 500 to be connected to array of flip-flops 506. In various embodiments, physical hardware clock 508 includes a counter. For example, if physical hardware clock 508 has an 80-bit counter, array of flip-flop 508 would include 80 corresponding flip-flops to capture each bit of the 80-bit counter. In various embodiments, array of flip-flops 506 detects input 502 (e.g., a rising edge of a trigger signal) and in response to detecting input 502 records the current state (e.g., current bit values of a counter) of physical hardware clock 508. Stated alternatively, in various embodiments, physical hardware clock 508 provides data values that array of flip-flops 506 samples in response to detection (e.g., rising edge detection) of a trigger signal. In the example shown, array of flip-flops 506 is connected to communication interface 512 (see below) so that what is stored in array of flip-flops 506 can be communicated out of NIC 500.

An advantage of utilizing the flip-flops mechanism shown here is that delay (with respect to the trigger signal) in capturing a current internal hardware clock value of physical hardware clock 508 is minimized because detection of the trigger signal and capturing the state of physical hardware clock 508 are performed at the same time (instead of first detecting the trigger signal with a first component and then capturing the state of physical hardware clock 508 with a second component). This direct setup also reduces variance in this type of delay across different NICs. The mechanism shown and described is merely illustrative. Components other than flip-flops that can capture state may also be used.

In various embodiments, control logic 510 determines whether input 502 is a trigger signal indicating an internal hardware clock value should be recorded or whether input 502 is some other signal that is customarily provided to PPS-In 504. Control logic 510 may distinguish between the trigger signal and some other signal by examining waveform patterns of input 502. If multiple types of signals have a sharp rising edge, then other signal/waveform components may be examined. In various embodiments, in order to avoid delay, control logic 510 determines whether input 502 is the trigger signal at the same or substantially the same time that array of flip-flops 506 samples physical hardware clock 508. It is also possible to utilize a dedicated port (a port whose sole function is to receive signals indicating the internal hardware clock value should be recorded) to receive the trigger signal, in which case control logic 510 does not need to determine what type of signal was received (because only one type of signal would be received). In various embodiments, control logic 510 is implemented as an integrated circuit component of NIC 500.

In various embodiments, control logic 510 directs communication interface 512 to send out (e.g., to a specified network address) the data stored in array of flip-flops 506 in response to a determination that the trigger signal was received (indicating array of flip-flops 506 just recorded a current PHC value). In response to a determination that the trigger signal was not received, control logic 510 would not direct communication interface 512 to send out the data stored in array of flip-flops 506. In some embodiments, the contents of array of flip-flops 506 are copied to a separate hardware register that communication interface 512 accesses and whose contents communication interface 512 transmits. The separate hardware register may be implemented as a plurality of flip flops or other circuits. In some embodiments, communication interface 512 utilizes an Ethernet protocol to send the contents of array of flip-flops 506 as output 514 over a network to a programmed computer system. In some embodiments, communication interface 512 includes a physical Ethernet connection port. In various embodiments, output 514 is an internal hardware clock value in a format that a programmed computer system can interpret. In various embodiments, communicating internal hardware clock values and sending/receiving network synchronization messages (e.g., PTP messages) occur using a common communications protocol (e.g., Ethernet).

Figure 6:
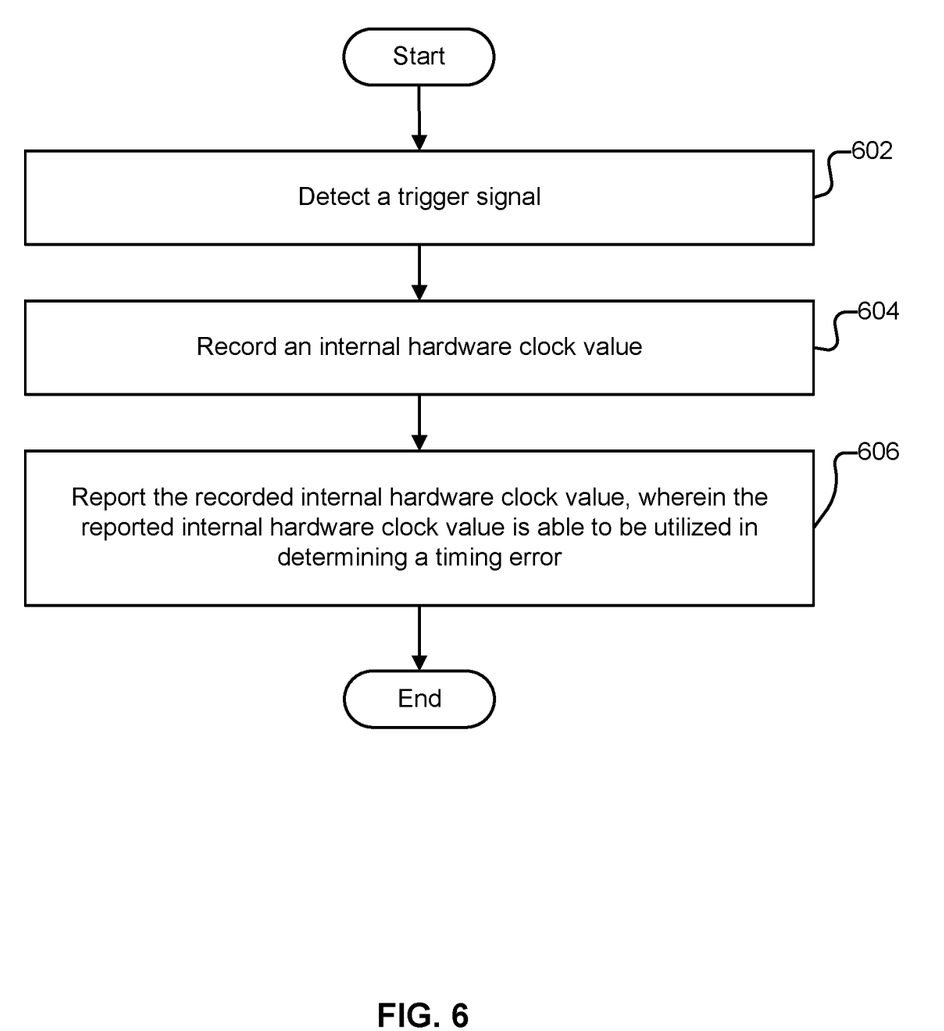
FIG. 6 is a flow chart illustrating an embodiment of a process for collecting and reporting data for use in evaluating a timing error.

FIG. 6 is a flow chart illustrating an embodiment of a process for collecting and reporting data for use in evaluating a timing error. In some embodiments, the process of FIG. 6 is performed by NIC 500 of FIG. 5. The process of FIG. 6 may also be performed by a clock device of FIG. 1 or a NIC of FIG. 4.

At 602, a trigger signal is detected. In some embodiments, the trigger signal is provided via a pulse-per-second input port of a network interface controller. For example, the trigger signal may be input 502 of FIG. 5 and be received at PPS-In 504 of NIC 500 of FIG. 5. In various embodiments, control logic (e.g., control logic 510 of FIG. 5) detects the trigger signal by distinguishing the trigger signal from any other type of signal that the pulse-per-second input port of the network interface controller may receive.

At 604, an internal hardware clock value is recorded. In various embodiments, the internal hardware clock value is a current time of the network interface controller and is recorded in response to the trigger signal. For example, the trigger signal may be utilized as a control signal to an array of flip-flops (e.g., array of flip-flops 506 of FIG. 5) to record bit values of a hardware counter (e.g., physical hardware clock 508 of FIG. 5). The bit values may also be transferred to a separate hardware register after being recorded by the array of flip-flops.

At 606, the recorded internal hardware clock value is reported. In some embodiments, the recorded internal hardware clock value is reported to a processor (e.g., host 418 of FIG. 4). The recorded internal hardware clock value may be reported using a communication interface (e.g., communication interface 512 of FIG. 5). In various embodiments, the reported internal hardware clock value is able to be utilized (e.g., by the processor) in determining a timing error of the network interface controller based at least in part on a time value of another device that also received the trigger signal. In some embodiments, the timing error is a discrepancy between the current time of the network interface controller and a current time of another network interface controller that is designated as the true time (the true time being the time of the other device that also received the trigger signal).

Thus, the other device that also received the trigger signal may be another network interface controller (e.g., a grandmaster) with a more accurate clock. In some embodiments, the more accurate clock is an atomic clock. In some embodiments, the timing error is determined by finding the difference between the reported internal hardware clock value and the true time. The other device can simultaneously (or substantially close to simultaneously) record a corresponding internal hardware clock value (the true time) because it is triggered to record the corresponding internal hardware clock value using the same trigger signal.

FIG. 7 is a functional diagram illustrating a programmed computer system. In some embodiments, the programmed computer system is host 418 of FIG. 4. In some embodiments, the programmed computer system receives the recorded internal hardware clock value reported at 606 of FIG. 6.

In the example shown, computer system 700 includes various subsystems as described below. Computer system 700 includes at least one microprocessor subsystem (also referred to as a processor or a central processing unit (CPU)) 702. For example, processor 702 can be implemented by a single-chip processor or by multiple processors. In some embodiments, processor 702 is a general-purpose digital processor that controls the operation of computer system 700. Using instructions retrieved from memory 710, processor 702 controls the reception and manipulation of input data, and the output and display of data on output devices (e.g., display 718).

Processor 702 is coupled bi-directionally with memory 710, which can include a first primary storage, typically a random-access memory (RAM), and a second primary storage area, typically a read-only memory (ROM). As is well known in the art, primary storage can be used as a general storage area and as scratch-pad memory, and can also be used to store input data and processed data. Primary storage can also store programming instructions and data, in the form of data objects and text objects, in addition to other data and instructions for processes operating on processor 702. Also, as is well known in the art, primary storage typically includes basic operating instructions, program code, data, and objects used by the processor 702 to perform its functions (e.g., programmed instructions). For example, memory 710 can include any suitable computer-readable storage media, described below, depending on whether, for example, data access needs to be bi-directional or uni-directional. For example, processor 702 can also directly and very rapidly retrieve and store frequently needed data in a cache memory (not shown).

Persistent memory 712 (e.g., a removable mass storage device) provides additional data storage capacity for computer system 700, and is coupled either bi-directionally (read/write) or uni-directionally (read only) to processor 702. For example, persistent memory 712 can also include computer-readable media such as magnetic tape, flash memory, PC-CARDS, portable mass storage devices, holographic storage devices, and other storage devices. A fixed mass storage 720 can also, for example, provide additional data storage capacity. The most common example of fixed mass storage 720 is a hard disk drive. Persistent memory 712 and fixed mass storage 720 generally store additional programming instructions, data, and the like that typically are not in active use by the processor 702. It will be appreciated that the information retained within persistent memory 712 and fixed mass storages 720 can be incorporated, if needed, in standard fashion as part of memory 710 (e.g., RAM) as virtual memory.

In addition to providing processor 702 access to storage subsystems, bus 714 can also be used to provide access to other subsystems and devices. As shown, these can include a display monitor 718, a network interface 716, a keyboard 704, and a pointing device 706, as well as an auxiliary input/output device interface, a sound card, speakers, and other subsystems as needed. For example, pointing device 706 can be a mouse, stylus, track ball, or tablet, and is useful for interacting with a graphical user interface.

Network interface 716 allows processor 702 to be coupled to another computer, computer network, or telecommunications network using a network connection as shown. For example, through network interface 716, processor 702 can receive information (e.g., data objects or program instructions) from another network or output information to another network in the course of performing method/process steps. Information, often represented as a sequence of instructions to be executed on a processor, can be received from and outputted to another network. An interface card or similar device and appropriate software implemented by (e.g., executed/performed on) processor 702 can be used to connect computer system 700 to an external network and transfer data according to standard protocols. Processes can be executed on processor 702, or can be performed across a network such as the Internet, intranet networks, or local area networks, in conjunction with a remote processor that shares a portion of the processing. Additional mass storage devices (not shown) can also be connected to processor 702 through network interface 716.

An auxiliary I/O device interface (not shown) can be used in conjunction with computer system 700. The auxiliary I/O device interface can include general and customized interfaces that allow processor 702 to send and, more typically, receive data from other devices such as microphones, touch-sensitive displays, transducer card readers, tape readers, voice or handwriting recognizers, biometrics readers, cameras, portable mass storage devices, and other computers.

In addition, various embodiments disclosed herein further relate to computer storage products with a computer readable medium that includes program code for performing various computer-implemented operations. The computer-readable medium is any data storage device that can store data which can thereafter be read by a computer system. Examples of computer-readable media include, but are not limited to, all the media mentioned above: magnetic media such as hard disks, floppy disks, and magnetic tape; optical media such as CD-ROM disks; magneto-optical media such as optical disks; and specially configured hardware devices such as application-specific integrated circuits (ASICs), programmable logic devices (PLDs), and ROM and RAM devices. Examples of program code include both machine code, as produced, for example, by a compiler, or files containing higher level code (e.g., script) that can be executed using an interpreter.

The computer system shown in FIG. 7 is but an example of a computer system suitable for use with the various embodiments disclosed herein. Other computer systems suitable for such use can include additional or fewer subsystems. In addition, bus 714 is illustrative of any interconnection scheme serving to link the subsystems. Other computer architectures having different configurations of subsystems can also be utilized.

FIG. 8 is a flow chart illustrating an embodiment of a process for determining a timing error based on collected data. In some embodiments, the process of FIG. 8 is performed by computer system 700 of FIG. 7. In some embodiments, at least a portion of the collected data is received as a result of reporting in 606 of FIG. 6.

At 802, a first internal hardware clock value is received from a first network interface controller. In some embodiments, the first network interface controller functions as a grandmaster for which the first internal hardware clock value is designated as an accurate clock value against which other clock values are compared. Stated alternatively, the first internal hardware clock value may be considered a true time against which other clock values are measured. In some embodiments, the first internal hardware clock value is received via a network (e.g., network 402 of FIG. 4). In some embodiments, the first internal hardware clock value is derived from a clock that is more accurate than other clocks in the network (e.g., an atomic clock). For example, the first network interface controller may include or be connected to an atomic clock and utilize the atomic clock to keep time instead of a type of clock NICs typically use to keep time. In some embodiments, the first network interface controller is NIC 500 of FIG. 5 or one of the NICs of system 400 of FIG. 4.

At 804, a second internal hardware clock value is received from a second network interface controller. In some embodiments, the second internal hardware clock value is received via the same network over which the first internal hardware clock value is transmitted. In some embodiments, the second network interface controller functions as an ordinary clock for which the second internal hardware clock value is considered an inaccurate clock value with respect to the first internal hardware clock value. In some embodiments, the second network interface controller is NIC 500 of FIG. 5 or one of the NICs of system 400 of FIG. 4.

At 806, a timing error of the second network interface controller is determined based on the first internal hardware clock value and the second internal hardware clock value. In various embodiments, the timing error is the difference in time values between the first internal hardware clock value and the second internal hardware clock value. In some embodiments, the timing error is determined by subtracting the second internal hardware clock value from the first internal hardware clock value to arrive a difference value. The difference value is an accurate reflection of the difference between times kept by the first network interface controller and the second network interface controller because the two network interface controllers, in various embodiments, receive the same trigger signal directing them to record the two internal hardware clock values at the same time. For example, signal generator 416 of FIG. 4 may be utilized to send a trigger signal to PPS input ports of the two network interface controllers at the same time, upon detection of which each network interface controller promptly records an internal hardware clock value (e.g., of physical hardware clock 508 of FIG. 5 by utilizing array of flip-flops 506 of FIG. 5).

In some embodiments, a user of a programmed computer system (e.g., computer system 700 of FIG. 7) views data associated with the timing error (e.g., value of the timing error, source of the timing error, properties of various NICs, etc.). The data may be displayed on a monitor of the programmed computer system and the user may be able to provide input related to data computation via a keyboard, mouse, etc. In some embodiments, the programmed computer system controls a signal generator (e.g., signal generator 416 of FIG. 4) to transmit a trigger signal to the first network interface controller and the second network interface controller. In some embodiments, the programmed computer system repeatedly determines the timing error of the second network interface controller as part of a feedback loop (e.g., a servo) that progressively reduces the timing error until the second internal hardware clock value is within a specified range of the first internal hardware clock value. Stated alternatively, as an application of the techniques disclosed herein, the second internal hardware clock value may be synchronized with the first internal hardware clock value.

An application of synchronization is simplification of data access in databases. For example, in a database in which machines A, B, and C are attempting to write to machine D at about the same time, without synchronization, an access priority protocol (e.g., three-way consensus) may be required. Such a protocol consumes time and resources (e.g., to check with each machine to determine which machine has priority to write). With synchronization, an alternative approach to data access may be based on determining which machine first made a write request based on comparing corresponding internal hardware clock values of machines A, B, and C.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
providing a trigger signal to a first network interface controller and a second network interface controller from a signal generator that is connected to the first network interface controller and the second network interface controller via separate data cables;
detecting the trigger signal via a pulse-per-second input port of the first network interface controller;
in response to the trigger signal, recording an internal hardware clock value of the first network interface controller, wherein recording the internal hardware clock value includes transferring a digital representation of the internal hardware clock value from a physical hardware counter to an array of flip-flops of the first network interface controller; and
reporting the recorded internal hardware clock value, wherein the reported internal hardware clock value is reported for use in determining a timing error of the first network interface controller based at least in part on a comparison with a time value of the second network interface controller.

2. The method of claim 1, wherein detecting the trigger signal includes determining that a signal received at the pulse-per-second input port is the trigger signal and not another type of signal that is received at the pulse-per-second input port.

3. The method of claim 1, wherein the signal generator is able to generate waveforms with sharply rising and/or falling edges.

4. The method of claim 1, wherein the trigger signal is one of a plurality of trigger signals repeatedly provided via the pulse-per-second input port with a specified periodicity.

5. The method of claim 1, wherein the internal hardware clock value is represented as a plurality of binary digits.

6. The method of claim 1, wherein recording the internal hardware clock value includes transferring a digital representation of the internal hardware clock value from a physical hardware counter to a hardware register.

7. The method of claim 1, wherein reporting the recorded internal hardware clock value includes transmitting the recorded internal hardware clock value via a network to a programmed computer system.

8. The method of claim 7, wherein the network is a local area network.

9. The method of claim 7, wherein the programmed computer system includes a user input component, a display component, and a data storage component.

10. The method of claim 1, wherein the timing error is a difference value calculated as the reported internal hardware clock value subtracted from the time value of the second network interface controller or vice versa.

11. The method of claim 1, wherein the time value of the second network interface controller is designated as a more accurate time than the internal hardware clock value.

12. The method of claim 11, wherein the time value of the second network interface controller is derived from an atomic clock or a GPS time source.

13. The method of claim 1, wherein the trigger signal is received by the second network interface controller at the same or substantially same time as the trigger signal is received by the first network interface controller.

14. The method of claim 1, wherein the time value of the second network interface controller is recorded by the second network interface controller at the same or substantially same time as the internal hardware clock value of the first network interface controller is recorded.

15. The method of claim 1, wherein the second network interface controller includes its own pulse-per-second input port through which the trigger signal was received at the second network interface controller.

16. The method of claim 1, wherein the first network interface controller includes a pulse-per-second output port.

17. The method of claim 1, wherein the timing error of the first network interface controller is utilized in synchronizing clock values of the first network interface controller and the second network interface controller.

18. A first network interface controller, comprising:
a pulse-per-second input port; and
one or more logic units configured to:
receive a trigger signal provided to the first network interface controller and a second network interface controller from a signal generator that is connected to the first network interface controller and the second network interface controller via separate data cables;
detect the trigger signal provided via the pulse-per-second input port;
in response to the trigger signal, cause recording of an internal hardware clock value of the first network interface controller, wherein recording the internal hardware clock value includes transferring a digital representation of the internal hardware clock value from a physical hardware counter to an array of flip-flops of the first network interface controller; and
cause reporting of the recorded internal hardware clock value, wherein the reported internal hardware clock value is reported for use in determining a timing error of the first network interface controller based at least in part on a comparison with a time value of the second network interface controller.

19. A system, comprising:
a first network interface controller, comprising:
a first pulse-per-second input port; and
a first set of one or more logic units configured to:
receive a trigger signal provided to the first network interface controller and a second network interface controller from a signal generator that is connected to the first network interface controller and the second network interface controller via separate data cables;

detect the trigger signal provided via the first pulse-per-second input port;
in response to the trigger signal, cause recording of a first internal hardware clock value of the first network interface controller, wherein recording the first internal hardware clock value includes transferring a digital representation of the first internal hardware clock value from a physical hardware counter to an array of flip-flops of the first network interface controller; and
cause reporting of the recorded first internal hardware clock value; and
the second network interface controller, comprising:
a second pulse-per-second input port; and
a second set of one or more logic units configured to:
detect the trigger signal provided via the second pulse-per-second input port;
in response to the trigger signal, cause recording of a second internal hardware clock value of the second network interface controller; and
cause reporting of the recorded second internal hardware clock value, wherein the reported second internal hardware clock value is reported for use in determining a timing error of the first network interface controller based at least in part on a comparison with the second internal hardware clock value of the second first network interface controller.

20. The system of claim 19, wherein the trigger signal is one of a plurality of trigger signals repeatedly provided via the first and second pulse-per-second input ports with a specified periodicity.

* * * * *